US012756023B2

(12) United States Patent
Essako

(10) Patent No.: US 12,756,023 B2
(45) Date of Patent: Oct. 6, 2026

(54) BATTERY ANALYZER AND METHOD OF USE

(71) Applicant: Flyzre LLC, Newport Beach, CA (US)

(72) Inventor: Edward Essako, Irvine, CA (US)

(73) Assignee: Flyzre LLC, Newport Beach, CA (US)

( * ) Notice: Subject to any disclaimer, the term of this patent is extended or adjusted under 35 U.S.C. 154(b) by 117 days.

(21) Appl. No.: 18/354,576

(22) Filed: Jul. 18, 2023

(65) Prior Publication Data

US 2024/0021893 A1 Jan. 18, 2024

Related U.S. Application Data

(60) Provisional application No. 63/390,253, filed on Jul. 18, 2022.

(51) Int. Cl.

| | |
|---|---|
| ***H01M 10/42*** | (2006.01) |
| ***G01R 31/36*** | (2020.01) |
| ***G01R 31/367*** | (2019.01) |
| ***G01R 31/385*** | (2019.01) |
| ***G01R 31/388*** | (2019.01) |

(52) U.S. Cl.

CPC .... *H01M 10/4285* (2013.01); *G01R 31/3648* (2013.01); *G01R 31/367* (2019.01); *G01R 31/386* (2019.01); *G01R 31/388* (2019.01)

(58) Field of Classification Search

CPC ............. H01M 10/4285; G01R 31/386; G01R 31/388; G01R 31/367; G01R 31/3648

USPC .............................. 324/500, 600, 76.11, 426

See application file for complete search history.

(56) References Cited

U.S. PATENT DOCUMENTS

| | | | | |
|---|---|---|---|---|
| 5,367,250 A * | 11/1994 | Whisenand | ............ | H01R 11/18 324/133 |
| 6,570,385 B1 * | 5/2003 | Roberts | ................ | G01R 31/007 324/378 |
| 2004/0054503 A1 * | 3/2004 | Namaky | ............. | G01R 31/007 702/183 |
| 2005/0017726 A1 * | 1/2005 | Koran | .................. | G01R 31/007 324/433 |
| 2005/0134282 A1 | 6/2005 | Averbuch | | |

(Continued)

FOREIGN PATENT DOCUMENTS

| | | |
|---|---|---|
| CN | 102253343 A | 11/2011 |
| CN | 103762624 A | 4/2014 |

(Continued)

OTHER PUBLICATIONS

Forklift Battery Basics, www.powerdesigners. com, Apr. 25, 2017.

*Primary Examiner* — Giovanni Astacio-Oquendo
*Assistant Examiner* — Trung Q Nguyen
(74) *Attorney, Agent, or Firm* — Joseph A. Andelin; Fish IP Law, LLP

(57) ABSTRACT

A battery analyzer device and its method of use are described. The device has a resistor electrically coupled between a first probe and a second probe. The device also has a pe momentary switch configured to produce a momentary signal between the first probe and second probe. An intelligent analytics software is programmed to measure an amperage load across the first probe and the second probe, and calculate a voltage based on the measured amperage load and a resistance of the resistor The intelligent analytics software is also programmed to display a battery health report on the device's interface.

17 Claims, 6 Drawing Sheets

(56) References Cited

U.S. PATENT DOCUMENTS

| | | | | |
|---|---|---|---|---|
| 2011/0300416 | A1* | 12/2011 | Bertness | H01M 10/4285 324/426 |
| 2016/0259015 | A1* | 9/2016 | Carlo | G01R 31/382 |
| 2016/0363634 | A1* | 12/2016 | Cheng | G01R 31/3647 |
| 2017/0234917 | A1* | 8/2017 | Weber | G01R 27/14 324/691 |
| 2021/0249702 | A1* | 8/2021 | Murphy | G01N 29/46 |
| 2021/0276450 | A1* | 9/2021 | Eshleman | B60L 58/12 |
| 2022/0334188 | A1* | 10/2022 | Burcar | G01R 31/38 |
| 2023/0358818 | A1* | 11/2023 | Kolamkar | G01R 31/3835 |
| 2023/0387707 | A1* | 11/2023 | Bertness | H02J 7/0042 |

FOREIGN PATENT DOCUMENTS

| | | | |
|---|---|---|---|
| CN | 104749533 | A | 7/2015 |
| CN | 105092977 | A | 11/2015 |
| CN | 207232342 | U | 4/2018 |
| CN | 209387253 | U | 9/2019 |
| CN | 209860099 | U | 12/2019 |
| CN | 213148166 | U | 5/2021 |
| WO | 2017152479 | A1 | 9/2017 |

* cited by examiner

BATTERY ANALYZER AND METHOD OF USE

This application claims priority to U.S. provisional application Ser. No. 63/390,253, filed on Jul. 18, 2022. These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

FIELD OF THE INVENTION

The field of the invention is battery analyzers, more specifically, devices and methods for analyzing battery health and capacity.

BACKGROUND

The background description includes information that may be useful in understanding the present invention. It is not an admission that any of the information provided herein is prior art or relevant to the presently claimed invention, or that any publication specifically or implicitly referenced is prior art.

Batteries play an important role in today's economy. Vehicles such as forklifts and other industrial equipment utilize battery power rather than combustible engines to safely operate indoors without any emissions concerns. Battery banks are also frequently used to provide backup power in case of power outages in places where it is critical to avoid any disruption in power, like hospitals. Various battery analyzers and chargers are known for preventative care and corrective maintenance. However, current battery analysis devices and methods are often-time consuming and inefficient.

The SBS-200CT Battery Discharge Cycle Tester sold by Exponential™ Power (https://www.exponentialpower.com/products-services/by-product/battery-test-equipment.html), for example, uses a charge and discharge method to put stress on a forklift battery to measure its life. Unfortunately, the charge and discharge method takes several hours and exposes the batteries to heat for extended periods.

The Battery Boss WC sold by Hawker® (https://www.hawkerpowersource.com/Accessories/Battery-Accessories/Battery-Boss-WC/) is another example. Like the SBS-200CT, this device uses a charge and discharge method that takes several hours, exposes the forklift battery to heat for extended periods of time, lessens battery life, and fails to provide an analysis of battery health in near-real time. The device is also stationary and is typically mounted on a wall creating a station where the forklift is parked during the long charge and discharge cycles.

CN207232342U teaches an automatic discharge test device for a forklift battery that uses 10 cycles (0 Q for 3 cycles, 0.7 Q for 5 cycles, 1 Q for 2 cycles). The test device uses a storage battery for collecting and displaying the discharge current value in real-time. This patent claims to reduce human error and cost, and improve reliability. However, the device uses a charge and discharge method and thus suffers from the same problems mentioned above.

CN209860099U teaches a device for determining whether a terminal of a forklift battery is burnt prior to high-rate discharge test. The test includes probing the battery terminals, providing a small current, and measuring the voltage drop. However, the device does not appear to measure battery status or life.

Some methods of rapid detection of battery health are known. For example, WO2017152479 and CN105092977 teach rapid detection of battery health by measuring internal resistance of the storage battery. The method of WO2017152479 includes the steps of enabling a storage battery to perform instantaneous large-current discharging via a controllable discharging circuit, monitoring a discharging current in the discharging circuit in the process via a current sample circuit, synchronously monitoring an end voltage of the storage battery via a voltage sampling circuit, and measuring an internal resistance of the storage battery according to a direct-current discharge method. However, WO2017152479, appears to use chips rather than solid state components, which can have a significantly higher margin of error, typically between 5% to 15%.

The method in CN105092977 includes the steps of generating a discharge loop that matches the capacity of the storage battery of discharge current, performing a heavy current millisecond pulsed discharge, detecting in the pulsed discharge process the variation process of a terminal voltage and the discharge current of the storage battery, calculating the internal resistance of the storage battery based on the Ohm law. However, the resistor in the measuring device of CN105092977 does not appear to have any regulator and fails to provide a means for reading currents as high as 500 amps, as found in many forklifts, backup battery banks, and other industrial equipment.

As another example, US20050134282 teaches a battery testing device that activates a short between battery poles for 10-50 μsec and measuring the voltage and current over a 100-200 μsec discharge. Paragraph says "in step 220, capacitor 106 charges the tested battery 101 by producing back current, flowing through resistor 108. At the next 20-30 μsec, the tested battery voltage will rise to a maximum valve 222." However, US20050134282 fails to contemplate using resistors that are sufficiently large to read 500 amps. Moreover, US20050134282 appears to be charging the capacitor as a back-up before introducing the charge to the battery, which is very inefficient because it is measuring the whole bank of the battery pack rather than each single cell individually.

CN104749533 teaches measuring state of health of a lithium ion battery using residual capacity, direct current resistance, and maximum available power. However, CN104749533 fails to measure health of lead acid batteries.

Thus, there remains a need for an improved battery analyzer that is light weight, portable, fast, easy-to-use, and provides near-real time battery health information without degrading battery life.

SUMMARY OF THE INVENTION

The inventive subject matter provides apparatus, systems, and methods in which intelligent analytics software and hardware reduces global battery waste by producing different numerical reading levels of each individual battery in a battery pack through a graphical representation. This approach allows for the replacement of individual batteries as needed, rather than replacing the entire pack. For example, a battery pack that contains twelve individual batteries working as one unit (pack) needs all twelve batteries to operate individually between a certain voltage range for optimal performance. Once one of the individual batteries starts operating below that range, the entire battery pack will begin to fail. The inventive devices contemplated herein allow a user to pinpoint which individual battery cell or cells need to be replaced inside each pack.

This is accomplished by providing a battery analyzer device that tests the amp load of each battery cell in the battery pack to determine the maximum capacity of each cell. The device comprises a probe for contacting the positive terminal of the battery and a probe for contacting the negative terminal. The probes are electrically coupled by a resistor and the resistor is electrically coupled with a momentary switch (e.g., measure pushbutton) for taking a measurement of each battery cell. The resistor is also electrically coupled with one or more heat sinks and a regulator. The device is operated by contacting the probes to the positive and negative terminals of an individual battery cell, triggering the momentary switch, and then taking a measurement of the cell's amp load. The amp reading and the resistance of the resistor are used to calculate a voltage reading of the battery cell using Omh's law (V=I×R).

If the nominal voltage on each battery is 2 volts, then the maximum voltage of the battery when fully charged is 2.45 volts and the battery will only work optimally at a range between 1.0 volts minimum and 2.45 volts maximum. If the voltage drops below 1.0, the battery will progressively deteriorate over time. The test typically takes less than five seconds for each cell, which greatly reduces the overall time to test the entire battery pack and virtually eliminates the chance of overheating the resister. Once voltage is calculated, the intelligent software then calculates battery capacity. The voltage, resistance, amperage, and capacity are then displayed to the user on the interface of the battery analyzer device.

Various objects, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

It should be noted that any language directed to a computer should be read to include any suitable combination of computing devices, including servers, interfaces, systems, databases, agents, peers, Engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. The following description includes information that may be useful in understanding the present invention. It is not an admission that any of the information provided herein is prior art or relevant to the presently claimed invention, or that any publication specifically or implicitly referenced is prior art.

Figure 1:
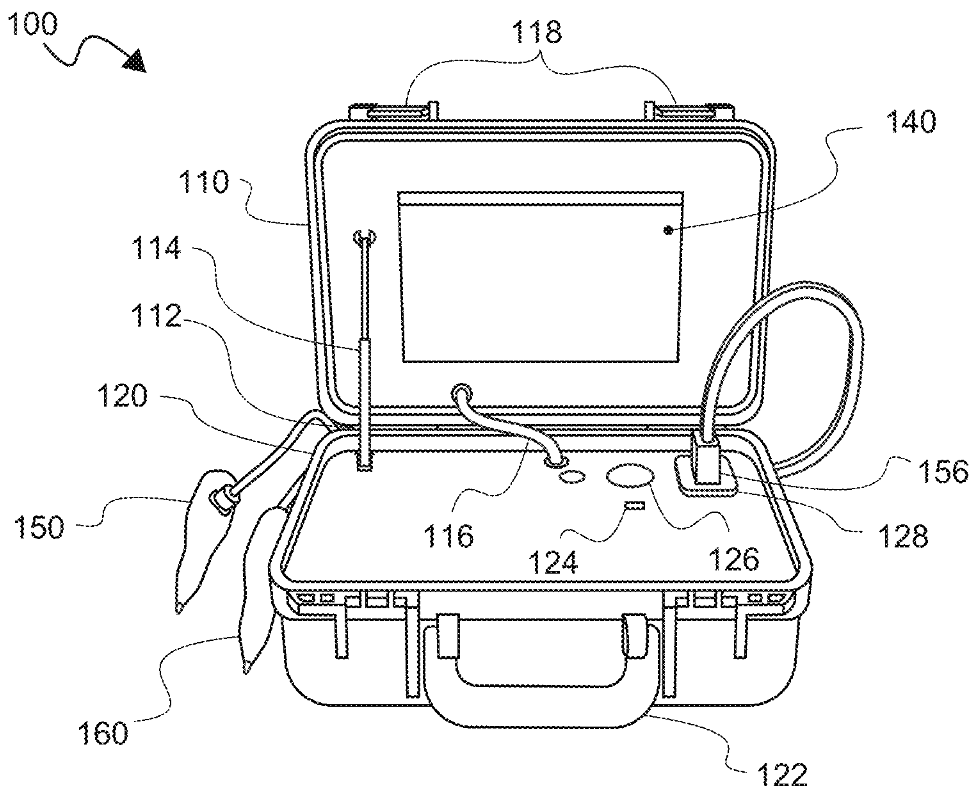
FIG. 1 is a front perspective view of a battery analyzer in an opened state.
Figure 2:
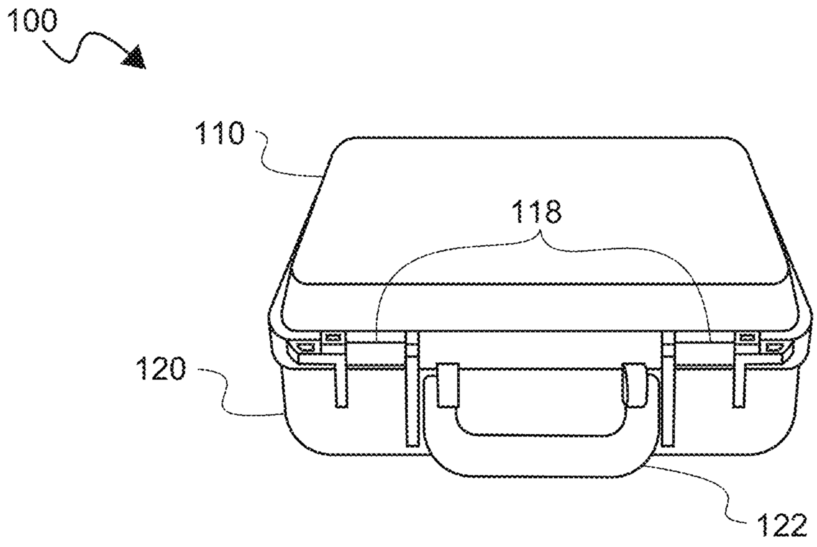
FIG. 2 is a front perspective view of the battery analyzer of FIG. 1 in a closed state.

FIG. 1 shows a battery analyzer device 100 in an opened state. FIG. 2 shows battery analyzer device 100 in a closed state. Device 100 has a first side 110 rotatably coupled with a second side 120 with a hinge 112 along a back edge and a dampener 114. Sides 110, 120 can be closed together for storing and protecting device 100, as shown in FIG. 2. Sides 110, 120 can be opened for accessing and using device 100, as shown in FIG. 1. Side 110 has an interface 140 configured to display information to a user on a screen. In some embodiments, interface 140 can comprise a touch screen that allows a user to send commands and configure the view. In yet other embodiments, device 100 can be coupled with input peripheral devices such as keyboards and mouses.

Side 120 has a probe port 128 for connecting a wired connector 156 from probes 150, 160. Side 120 stores and protects electrical components, such as resistors, regulators, heat sinks, power supplies, communication devices, and other computer hardware and circuitry. Side 120 also has an on/off switch 126, a USB port 124 for sending battery health reports to a user, and a connecting cable 116 coupled with interface 140 in side 110. Side 120 also has a handle 122 for carrying device 100 in the closed state. Side 120 also has executable software instructions including an intelligent analytics module programmed to (i) operate a power supply to heat a resistor electrically coupled between probe 150 and probe 160, (i) measure an amperage load across probe 150 and probe 160, and (iii) calculate a voltage based on the measured amperage load and a resistance of the resistor in its heated state.

Figure 3:
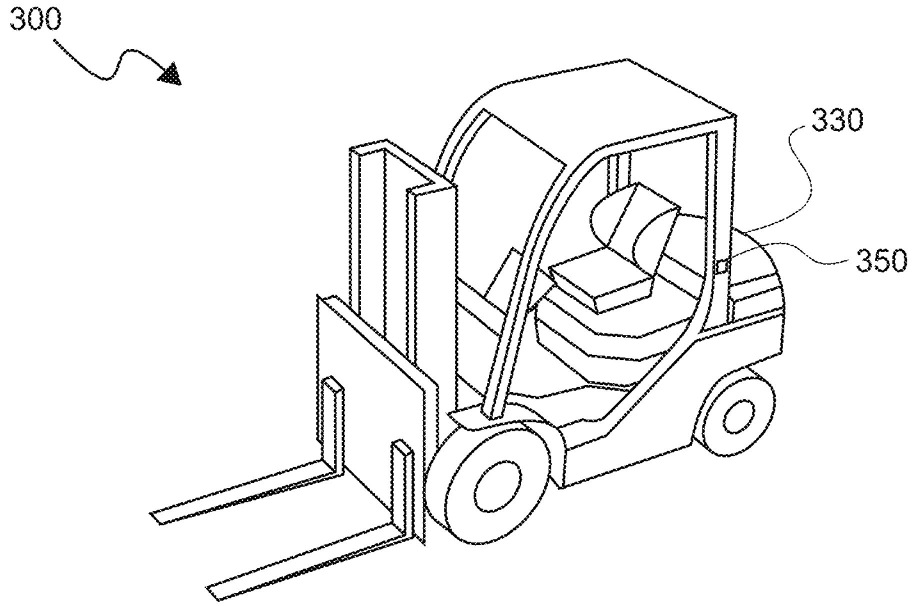
FIG. 3 is a perspective view of a forklift with a battery back and a unique identifier.

FIG. 3 shows a forklift 300, which has a rear compartment for storing a 6 cell battery pack 330. Forklift 300 also has a unique identifier 350.

Figure 4:
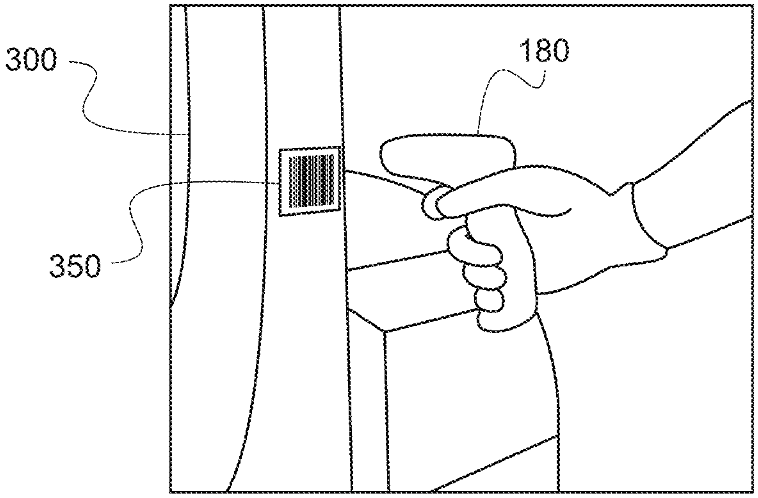
FIG. 4 is a perspective view of a scanner reading the unique identifier of the forklift of FIG. 3.

FIG. 4 shows a scanner 180 reading unique identifier 350 on forklift 300. Unique identifier 350 is a bar code, however any readable or detectable unique identifier can be used. Scanner 180 is wirelessly communicatively coupled with device 100 and sends unique identifier 350 to the intelligent analytics module to either register a new forklift or recall a known/registered forklift.

Figure 5:
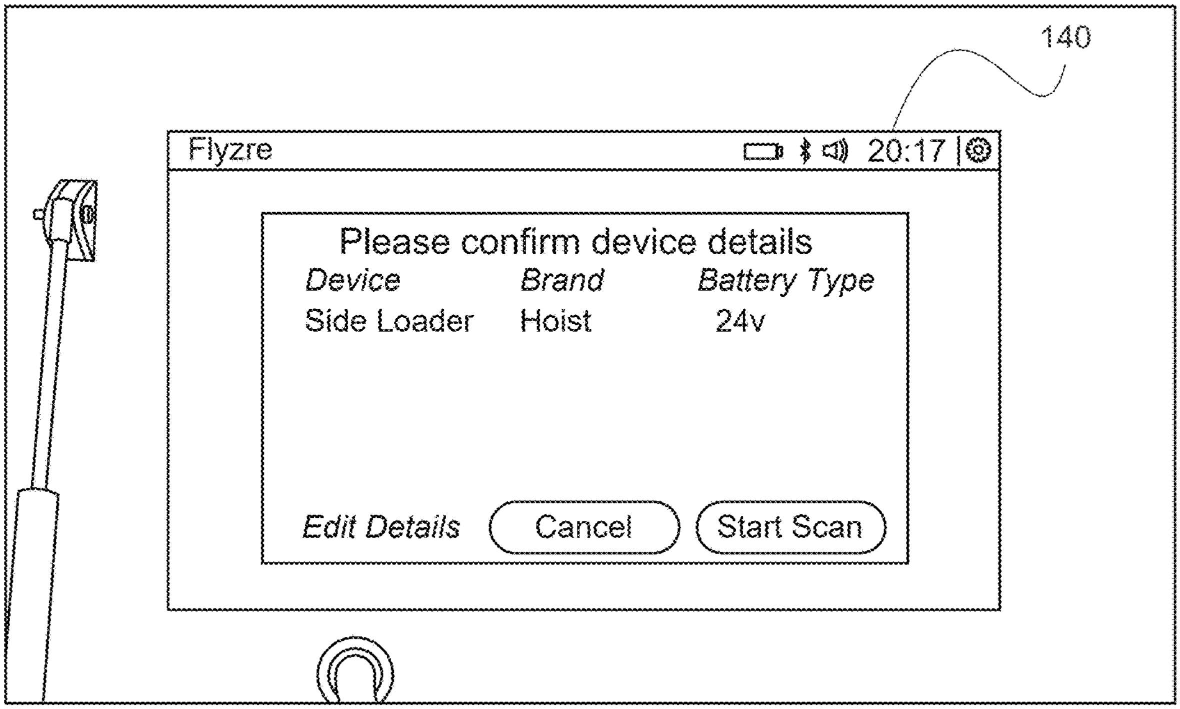
FIG. 5 is a close-up view of the interface display of device 100 of FIG. 1.

FIG. 5 shows interface 140 of device 100 after receiving unique identifier 350 from scanner 180. Interface 140 shows device details (e.g., device name, brand name, battery type) for unique identifier 350. The user can select to edit details, cancel, or start a scan (e.g., battery health test).

Figure 6:
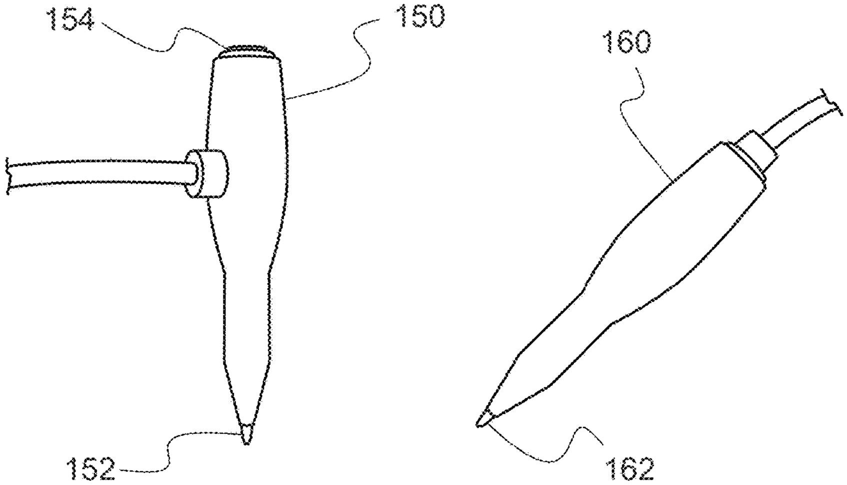
FIG. 6 is a close-up view of the positive and negative probes of the device of FIG. 1.
Figure 7:
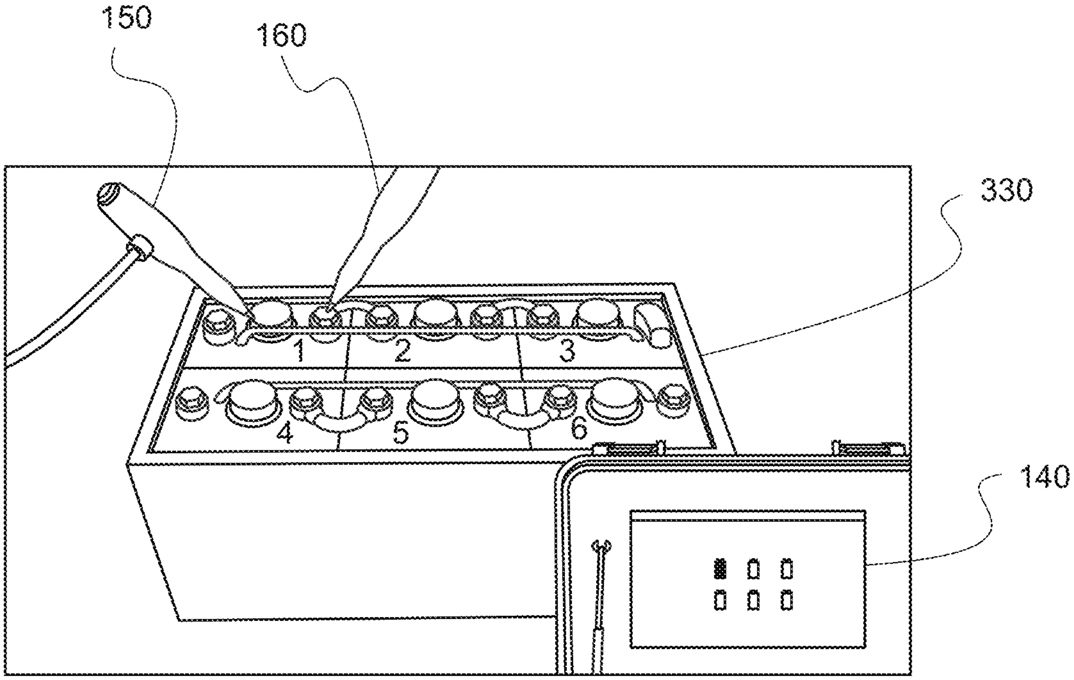
FIG. 7 shows cell 1 of battery pack 330 of forklift 300 of FIG. 3 being tested with device 100 of FIG. 1.
Figure 8:
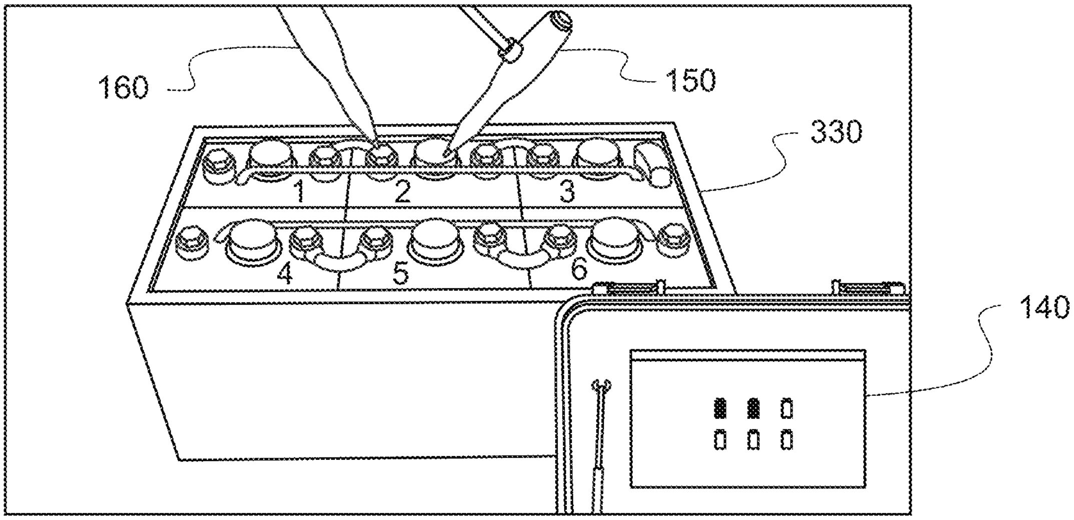
FIG. 8 shows cell 2 of battery pack 330 of forklift 300 of FIG. 3 being tested with device 100 of FIG. 1.
Figure 9:
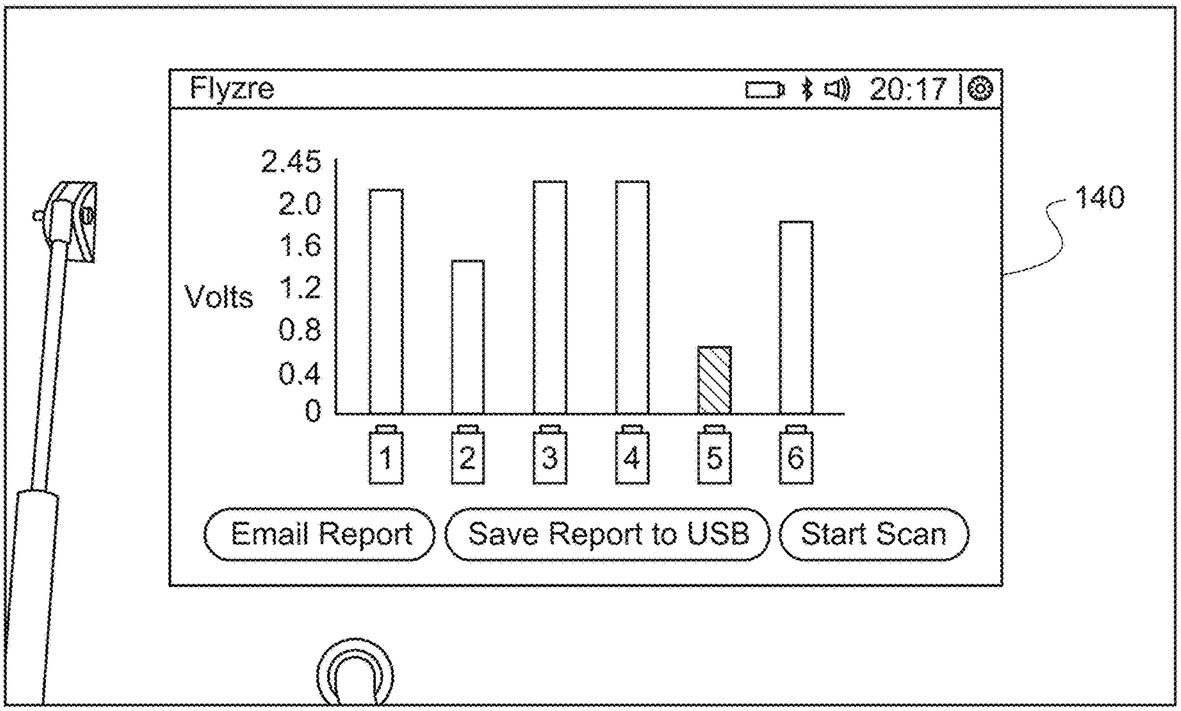
FIG. 9 shows the interface display of device 100 of FIG. 1 showing a battery health report.

FIG. 6 shows an electrical contact 152 and a pushbutton 154 of probe 150 and an electrical contact 162 of probe 160. Once the user selects "start scan," interface 140 then displays a layout of cells 1-6, which corresponds to the layout of cells 1-6 in battery pack 330, as shown in FIG. 7. It is contemplated that battery pack 300 could comprise any number of battery cells (e.g., one to nth cells) without departing from the inventive concepts disclosed herein. The first cell to be tested is highlighted in interface 140, and the user is prompted to briefly touch electrical contact 152 of probe 150 to the positive contact of cell 1 and to briefly touch electrical contact 162 of probe 160 to the negative contact of cell 1. After several seconds, a test completion is indicated, and the user is prompted to proceed to test cell 2, as shown in FIG. 8. Once all six cells have been tested, interface 140 displays a battery health report showing the individual health of each battery cell battery pack 330 in near-real time, as shown in FIG. 9.

Figure 10:
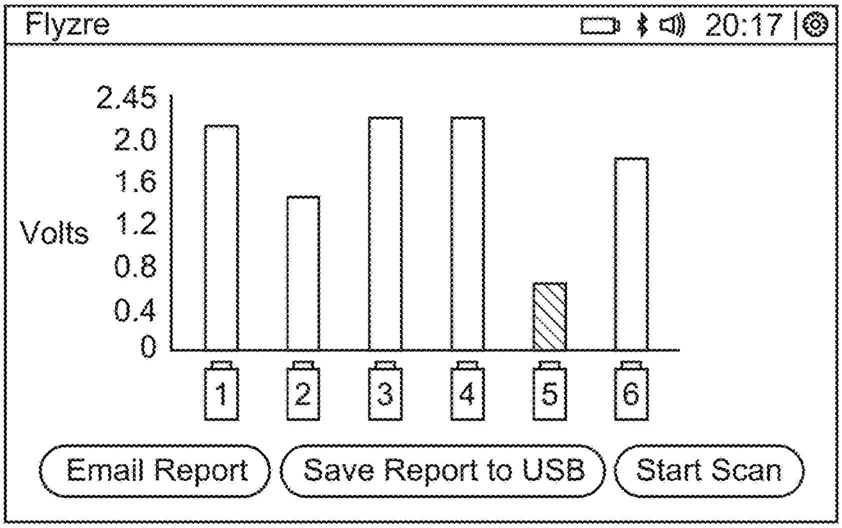
FIG. 10 is a close-up of the battery health report of FIG. 9.

FIG. 10 shows a close-up of the battery health report, which comprises a bar chart with a measured voltage along the y-axis from 0 to 2.45 volts (V), and each of the six cell numbers along the x-axis from 1 to 6. Along the x-axis, battery health data for each cell can be shown, including a measured voltage (v) (e.g., 2.1, 1.5, 2.3, 2.3, 0.7, 1.8), an amperage load (A) (e.g., 200 amps), and a capacity in watt-hours (Wh) (e.g., 400 Wh at full capacity). Cell 5 is below its acceptable health and is affecting health of all the other cells. Cell 5 is shown in a red color to indicate poor health while the remaining cells are shown in a green color to indicate good health. The user can select "email report" to send the battery health report to an email address, "save report to USB" to send the battery health report to a USB memory device, or "done" to exit the battery health report. The report is stored to a history for the unique identifier, which represents forklift 300.

Figure 11:
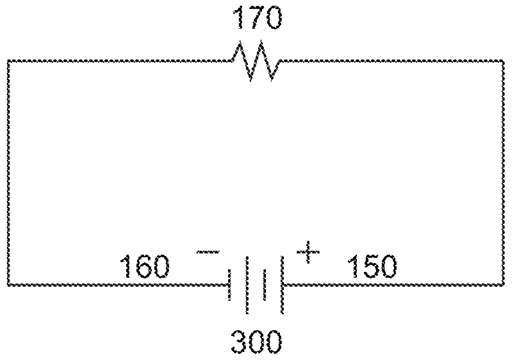
FIG. 11 shows a schematic of a circuit in device 100 of FIG. 1 with probe 150, probe 160, resistor 170, and positive/negative terminals of a cell in battery pack 300 electrically coupled.

FIG. 11 shows a resistor 170 electrically coupled between probe 150 and probe 160. Probe 150 and probe 160 are electrically coupled to the positive and negative terminals of battery pack 300, thereby forming the circuit shown in FIG. 11. At this time, pushbutton 154 is triggered to create a momentary signal between probe 150 and probe 160, the intelligent analytics module measures an amperage from probe 150 to probe 160, and then calculates a voltage based on the amperage and resistance of heated resistor 170.

Figure 12:
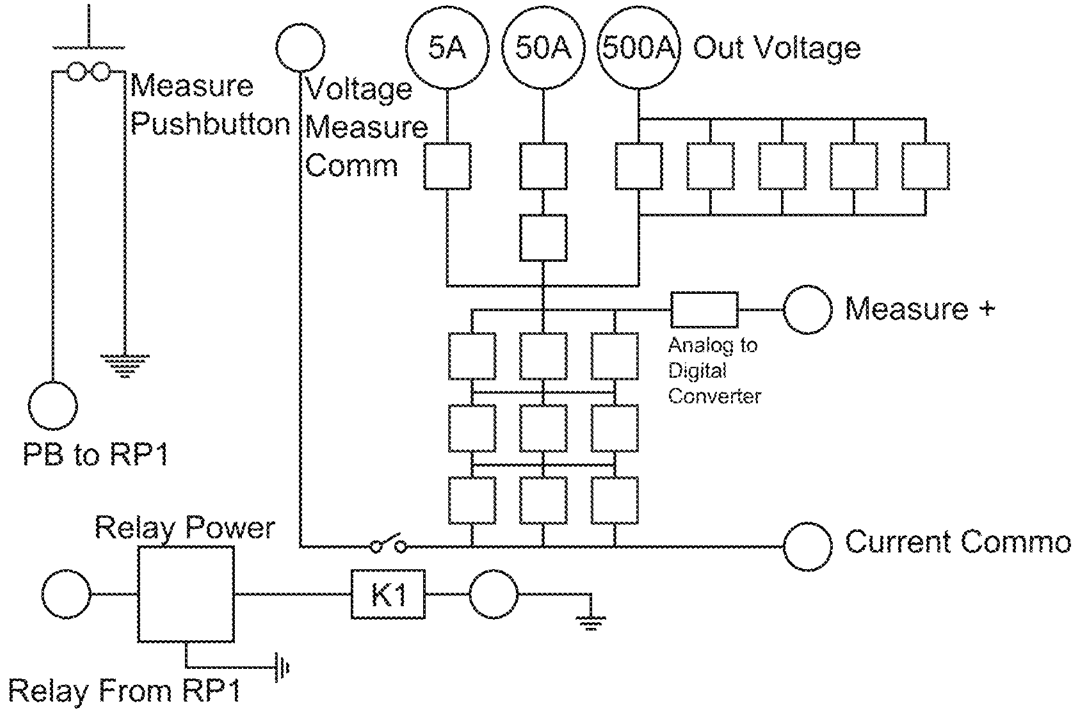
FIG. 12 shows a more detailed schematic of a circuit in device 100 of FIG. 1 with probe 150, probe 160, resistor 170, and positive/negative terminals of a cell in battery pack 300 electrically coupled.

FIG. 12 shows a schematic of a solid state electrical circuit comprising a plurality of resistors shown as squares. The plurality of resistors are coupled with a heat sink. The plurality of resistors are electrically disposed between "measure+," which represents probe 150, and "current common," which represents probe 160. When first probe 150 and second probe 160 are in contact with the negative and positive terminals of a cell, respectively, and "measure pushbutton" is mechanically triggered, a momentary signal (e.g., less than one second, less than 0.1 seconds, less than 0.001 seconds) is sent from voltage measure to the plurality of resisters and the resistors are heated by the solid state circuitry. The total resistance of the heated resistors is preferably about 0.01 ohms plus or minus 1%. The intelligent analytics module then (i) measures the amperage passing from first probe 150 to second probe 160, and (ii) calculates a voltage based on Omh's law (V=I×R). The intelligent analytics software also calculates cell capacity in units of watt-hours (Wh). The battery health test results are then displayed to the user on interface 140.

The inventive devices described herein provide a fast, safe and accurate method for measuring the health of each individual cell in a battery pack without degrading battery life. The device is also light weight, portable, and simple enough to be used by a non-technical person with minimal training. Contemplated devices provide near-real time information about battery health for each cell within a battery pack. Contemplated devices and methods also provide tamper-proof and accurate readings and with the option to send battery health reports to a user via email and/or a USB port.

Thus, the inventive subject matter provides devices and methods for analyzing battery health of individuals cells in a battery pack in near-real time in a fast and efficient manner without degrading health of the cell or battery pack. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

As used herein, and unless the context dictates otherwise, the term "attached to" and "coupled to" are intended to include both direct coupling (in which two elements that are coupled to each other contact each other) and indirect coupling (in which at least one additional element is located between the two elements). Therefore, the terms "attached to," "coupled to," "attached with," and "coupled with" are used synonymously.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

It should be apparent to those skilled in the art that many more modifications besides those already described are possible without departing from the inventive concepts herein. The inventive subject matter, therefore, is not to be restricted except in the spirit of the amended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification refers to at least one of something selected from the group consisting of A, B, C . . . and N, the text should be interpreted as requiring only one element from the group, not A plus N, or B plus N, etc.

What is claimed is:

1. A battery analyzer device comprising:

a first probe;

a second probe;

solid-state circuitry including one or more resistors electrically coupled between the first probe and the second probe;

a power supply electrically coupled with the solid-state circuitry;

a relay-controlled switch electrically coupled between the power supply and the solid-state circuitry; and a momentary pushbutton configured to activate the relay-controlled switch, wherein the power supply and the solid-state circuitry are configured to generate a momentary amperage load between the first probe and the second probe in response to activation of the momentary pushbutton.

2. The battery analyzer device of claim 1, further comprising intelligent analytics software configured to:

measure the momentary amperage load across the first probe and the second probe; and calculate a voltage based on the measured amperage load and a resistance of the one or more resistors.

3. The battery analyzer device of claim 2, further comprising an interface.

4. The battery analyzer device of claim 3, wherein the intelligent analytics software is further configured to display a graph of the calculated voltage for a first battery cell through nth battery cell.

5. A method of measuring capacity of a first battery cell in a battery pack using the device of claim 4, comprising:

contacting the first probe to a positive terminal of the first battery cell;

contacting the second probe to a negative terminal of the first battery cell;

triggering the momentary pushbutton;

measuring a momentary amperage load between the positive terminal and the negative terminal;

calculating a voltage between the positive terminal and negative terminal using the measured amperage load and a resistance of the one or more resistors.

6. The method of claim 5, further comprising the step of calculating capacity of the first battery cell.

7. The method of claim 6, further comprising the step of repeating the method for a second through nth battery cell.

8. The method of claim 7, further comprising the step of generating and displaying a graph of the capacity for the first through nth battery cell.

9. A battery analyzer device for testing individual cells within a battery pack comprising:

a solid-state circuitry comprising one or more resistors electrically coupled between a first probe and a second probe;

a power supply electrically coupled with the solid-state circuitry;

a relay-controlled switch electrically coupled between the power supply and the solid-state circuitry;

a momentary pushbutton configured to activate the relay-controlled switch;

an intelligent analytics software programmed to (i) measure a momentary amperage load between the first probe and the second probe, and (ii) calculate a voltage based on the measured amperage load and a resistance of the one or more resistors; and an interface configured to display a battery health report based on the measured amperage and the calculated voltage.

10. The battery analyzer device of claim 9, wherein the battery health report displays health data for each individual cell within the battery pack.

11. The battery analyzer device of claim 9, wherein the battery health report includes capacity in power watt-hours (Wh).

12. The battery analyzer device of claim 9, further comprising a scanner for reading a unique identifier wireless communicatively coupled with the intelligent analytics software.

13. The battery analyzer device of claim 12, wherein the intelligent analytics software is further programmed to register the unique identifier with an allocated non-transitory storage medium for saving the battery health report and any subsequent battery health reports.

14. The battery analyzer device of claim 13, wherein the intelligent analytics software is further programmed to send the battery health report to a USB port.

15. The battery analyzer device of claim 14, wherein the intelligent analytics software is further programmed to send the battery health report to an email address via a wireless communication.

16. The battery analyzer device of claim 9, wherein the solid-state circuitry comprises one or more heat sinks coupled with the one or more resistors.

17. The battery analyzer device of claim 9, wherein the solid-state circuitry comprises a regulator coupled with the one or more resistors.

* * * * *